United States Patent
Kaivo-Oja

(10) Patent No.: US 10,631,433 B2
(45) Date of Patent: Apr. 21, 2020

(54) DOOR COOLER

(71) Applicant: VACON OY, Vaasa (FI)

(72) Inventor: Harri Kaivo-Oja, Vaasa (FI)

(73) Assignee: Vacon OY, Vaasa (FI)

( * ) Notice: Subject to any disclaimer, the term of this patent is extended or adjusted under 35 U.S.C. 154(b) by 0 days.

(21) Appl. No.: 15/868,207

(22) Filed: Jan. 11, 2018

(65) Prior Publication Data

US 2018/0199467 A1 Jul. 12, 2018

(30) Foreign Application Priority Data

Jan. 12, 2017 (DE) .................. 20 2017 100 139 U

(51) Int. Cl.
*H05K 7/20* (2006.01)
*H05K 5/03* (2006.01)

(52) U.S. Cl.
CPC .......... *H05K 7/20272* (2013.01); *H05K 5/03* (2013.01); *H05K 7/20145* (2013.01); *H05K 7/20609* (2013.01); *H05K 7/20927* (2013.01)

(58) Field of Classification Search
CPC ... H01L 23/427; G06F 2200/201; G06F 1/20; G06F 1/203; G06F 2200/203; G06F 1/206; G06F 1/1616; G06F 1/181; H05K 7/20781; H05K 7/20809; H05K 7/2079; H05K 7/20836; H05K 7/20772; H05K 7/20763; H05K 7/20827; H05K 7/20; H05K 7/20318; H05K 7/20336; H05K 7/20281; H05K 7/20818; H05K 7/20736; H05K 7/20309; H05K 7/20327; H05K 7/20745; H05K 7/20272; H05K 7/20381; H05K 7/2099; H05K 7/20136; H05K 7/20709; H05K 7/20927; H05K 7/2039; H05K 7/20609;
(Continued)

(56) References Cited

U.S. PATENT DOCUMENTS 3,396,780 A * 8/1968 Koltuniak ............... C25D 21/02
165/104.34
4,365,666 A * 12/1982 Seifert .................... F28F 3/048
165/104.29
(Continued)

FOREIGN PATENT DOCUMENTS

CN 201174085 Y 12/2008
CN 203177364 U 9/2013
(Continued)

OTHER PUBLICATIONS

Chinese Second Office Action and English Translation for Serial No. 2017113759150 dated Dec. 9, 2019.

*Primary Examiner* — Adam B Dravininkas
(74) *Attorney, Agent, or Firm* — McCormick, Paulding & Huber PLLC

(57) ABSTRACT

An arrangement for cooling the inside air of an enclosure of a liquid cooled power electronic device, the arrangement comprising an air to liquid heat exchanger attached to the door of an enclosure, and means for circulating the inside air of the enclosure through an air channel of the heat exchanger. The heat exchanger comprises a cooler with internal liquid circulation, assembled inside the air channel and connected to the main liquid circulation of the enclosure, for example by flexible connection pipes, which allow the enclosure door to be opened without disturbing the liquid circulation.

17 Claims, 2 Drawing Sheets

(58) Field of Classification Search
CPC ........... H05K 7/20536; H05K 7/20972; H05K 7/1488
See application file for complete search history.

(56) References Cited

U.S. PATENT DOCUMENTS

| | | | | | |
|---|---|---|---|---|---|
| 4,535,386 | A | * | 8/1985 | Frey, Jr. | H05K 7/206 165/104.33 |
| 5,467,250 | A | * | 11/1995 | Howard | H05K 7/206 165/122 |
| 6,164,369 | A | * | 12/2000 | Stoller | H05K 7/20572 165/104.33 |
| 6,889,752 | B2 | * | 5/2005 | Stoller | H05K 7/206 165/122 |
| 7,245,485 | B1 | * | 7/2007 | Morrell | G06F 1/181 361/679.48 |
| 7,660,109 | B2 | * | 2/2010 | Iyengar | H05K 7/20754 165/104.33 |
| 2008/0259566 | A1 | * | 10/2008 | Fried | H05K 7/20809 361/699 |
| 2009/0100848 | A1 | * | 4/2009 | Kuriyama | H05K 7/20745 62/132 |
| 2009/0225514 | A1 | * | 9/2009 | Correa | H05K 7/20781 361/701 |
| 2010/0002393 | A1 | * | 1/2010 | Campbell | H05K 7/20772 361/699 |
| 2010/0033931 | A1 | * | 2/2010 | Miyazawa | H05K 7/20745 361/696 |
| 2013/0032310 | A1 | * | 2/2013 | Jaena | F28D 15/02 165/104.25 |
| 2014/0362520 | A1 | * | 12/2014 | Alshinnawi | H05K 7/20781 361/679.47 |
| 2015/0009620 | A1 | | 1/2015 | Kadotani et al. | |

FOREIGN PATENT DOCUMENTS

| | | |
|---|---|---|
| CN | 103402334 A | 11/2013 |
| CN | 203340500 U | 12/2013 |
| CN | 103616941 A | 3/2014 |
| CN | 203615671 U | 5/2014 |
| CN | 104703448 A | 6/2015 |
| CN | 104994707 A | 10/2015 |
| CN | 105656289 A | 6/2016 |
| DE | 102014105051 A1 | 10/2014 |
| JP | 2016103876 A | 6/2016 |

* cited by examiner

DOOR COOLER

CROSS-REFERENCE TO RELATED APPLICATION

This application claims foreign priority benefits under U.S.C. § 119 to German Patent Application No. 20 2017 100 139.3 filed on Jan. 12, 2017, the content of which is hereby incorporated by reference in its entirety.

TECHNICAL FIELD

The present invention is related to an arrangement for cooling the inside air of an enclosure wherein a liquid-cooled power electronics device is mounted.

BACKGROUND

The general development trend of power electronics devices, such as frequency converters, is an increase in power density. It is known in the art that handling of high power in a small-sized device requires effective cooling of the power components, for example with liquid cooling, i.e. by transferring the dissipation power via liquid circulation from the components to outside the device.

High power electronics devices, like liquid cooled frequency converters or their separate submodules, are normally mounted inside enclosures which ensure e.g. the electric safety of the user. In spite of that the structures which are in contact to the components producing major part of the power dissipation are effectively cooled by liquid, power dissipation will normally be generated also in some other parts which are not cooled by liquid, e.g. in fuses, high power busbars, printed circuit boards (PCB), and the like. This power loss, in combination with warm surfaces of the high power liquid-cooled structures, cause warming of the air inside the enclosure to an extent that may be harmful for e.g. to components on PCBs.

The interior air of an enclosure can be cooled by circulating external air through it. This, however, may be problematic e.g. in dirty environments wherein a high degree of protection of the enclosure is required.

SUMMARY

The object of the present invention is to provide a novel cooling arrangement for an electric system wherein liquid-cooled high power devices are mounted inside an enclosure. According to the invention, an air to liquid heat exchanger is attached in the door of the enclosure, and the inside air of the enclosure is cooled by a closed circulation through the heat exchanger. The following is a brief summary in order to provide basic understanding of some aspects of various embodiments of the invention, a more detailed description of exemplifying embodiments are given later. The objective of the invention is achieved by what is stated in the independent claims, other preferred embodiments are disclosed in the dependent claims.

According to the invention, the cooling arrangement comprises an air to liquid heat exchanger which is attached to the door of an enclosure, and means for circulating the inside air of the enclosure through the heat exchanger. The heat exchanger comprises an air channel through which the air passes (generally vertically). Further, the heat exchanger comprises a cooler with internal liquid circulation, assembled inside the air channel and connected to the main liquid circulation of the enclosure (for example, by flexible connection pipes or some other means which allows the enclosure door to be opened without disturbing the liquid circulation). The invention does not set any special requirements for the cooler itself, it may be a known type like a brushed pipe or a ribbed heatsink.

According to an embodiment of the invention, the cooling air channel is arranged to the inside of the enclosure door by using at least one essentially plate-like part, made of e.g. sheet metal, having at least one aperture on top end and at least one aperture on bottom end to allow the air circulation.

According to an embodiment of the invention, the cooling air channel is arranged to the outside of the enclosure door by using at least one essentially plate-like part, made of e.g. sheet metal. The arrangement further comprises at least one aperture on top end and at least one aperture on bottom end of the enclosure door to allow the air circulation.

According to an embodiment of the invention, the door of the enclosure forms one side wall of the cooling air channel.

According to an embodiment of the invention, the cooling air circulation works by gravity, i.e. such that the warm air enters the air channel through the aperture(s) on top, cools in the air channel thus becoming heavier and sinking down out of the channel through the aperture(s) on bottom.

According to an embodiment of the invention, the cooling air circulation is forced by at least one fan, mounted advantageously on a bottom aperture of the air channel such that the air flow direction is from top to bottom. Opposite direction of the air flow is also possible.

When the enclosure door is closed, the air circulation in the system comprising the interior of the enclosure and the door-mounted air channel is fully closed, thus the cooling arrangement according to the invention sets no limits for the protection class of the enclosure.

The invention also provides a liquid cooled power electronic converter, such as a frequency converter, mounted inside an enclosure such that the inside air of the enclosure is cooled by circulating the air through an air channel of an air to liquid heat exchanger attached to the enclosure door. The air to liquid heat exchanger further comprises a cooler with internal liquid circulation, assembled inside the air channel and connected to the main liquid circulation of the enclosure (for example by flexible connection pipes or some other means which allow the enclosure door to be opened without disturbing the liquid circulation).

The invention is best understood on the basis of the following description and accompanying drawings, comprising various exemplifying and nonlimiting embodiments together with additional objects and advantages thereof.

BRIEF DESCRIPTION OF THE DRAWINGS

Below the invention appears a more detailed explanation using examples with references to the enclosed figures, wherein.

DETAILED DESCRIPTION

Figure 1A:
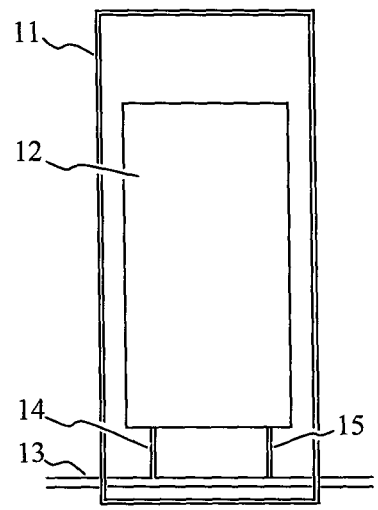
FIGS. 1A and 1B present a liquid cooled power module assembly.
Figure 1B:
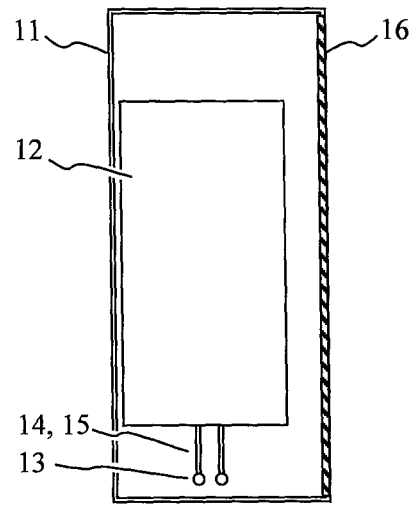

FIGS. 1A and 1B present a simplified illustration of an assembly 10 such that the left hand part of the figure shows a front view and the right hand part a side view. In the figure, a liquid cooled power electronics module 12 is mounted inside an enclosure 11 having a door 16 (highlighted with diagonal lines). The module 12 is connected to the main cooling liquid pipes 13 by connection pipes 14, 15. Details of the installation are not shown in these nor in the other figures of this document, as being unessential from the invention description point of view and obvious for a person skilled in the art.

In industrial installations the floor space is normally limited which is the reason for mounting power modules in as narrow as possible enclosures. Thus e.g. the space between the side walls of the enclosure 11 and the power module 12 is normally very limited (FIG. 1A). The space between the door 16 and the power module 12 (FIG. 1B) is often wider due to standardized dimensions of the commercial enclosure systems. Therefore add-on parts are preferably mounted on the door than on the side walls.

Figure 2:
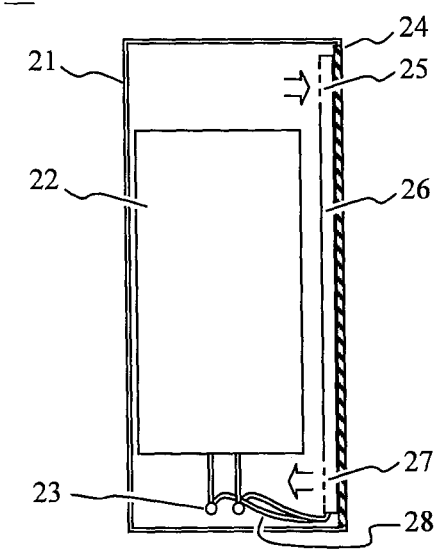
FIGS. 2 and 3 present embodiments of cooling arrangements according to the present invention.

FIG. 2 presents cooling arrangement 20 according to the present invention, as similar side view of a power module 22 inside an enclosure 21 as presented in FIG. 1B. An air to liquid heat exchanger 26 is attached to the inside of the enclosure door 24 such that the incoming warm air enters the heat exchanger through the top end aperture 25 and the cooled exhaust air leaves the heat exchanger through the bottom end aperture 27. The heat exchanger 26 is connected to the main cooling liquid circulation pipes 23 via flexible connecting pipes 28, which allow the door 24 to be opened. According to the invention, the air circulation inside the enclosure and through the air channel of the heat exchanger 26 is closed.

Figure 3:
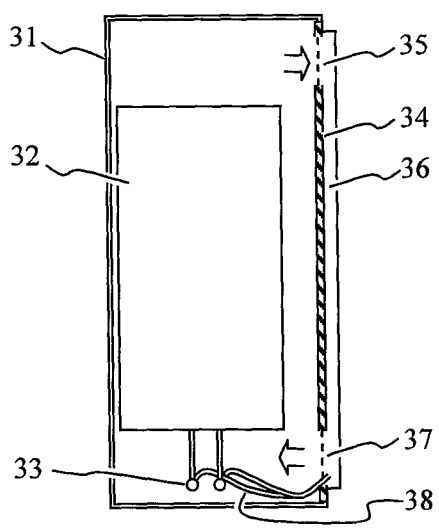

FIG. 3 presents a similar cooling arrangement 30 as presented in FIG. 2, but in this case the heat exchanger 36 is attached to the outside of the enclosure door 34. Due to the heat exchanger location the apertures 35 and 37 for incoming and exhausting air are pierced in the door 34. The arrangements for mounting the liquid cooled power module 32 in the enclosure 31 and connecting the heat exchanger 36 via flexible connecting pipes 38 to the main cooling liquid circulation pipes 33 are similar to FIG. 2.

Figure 4:
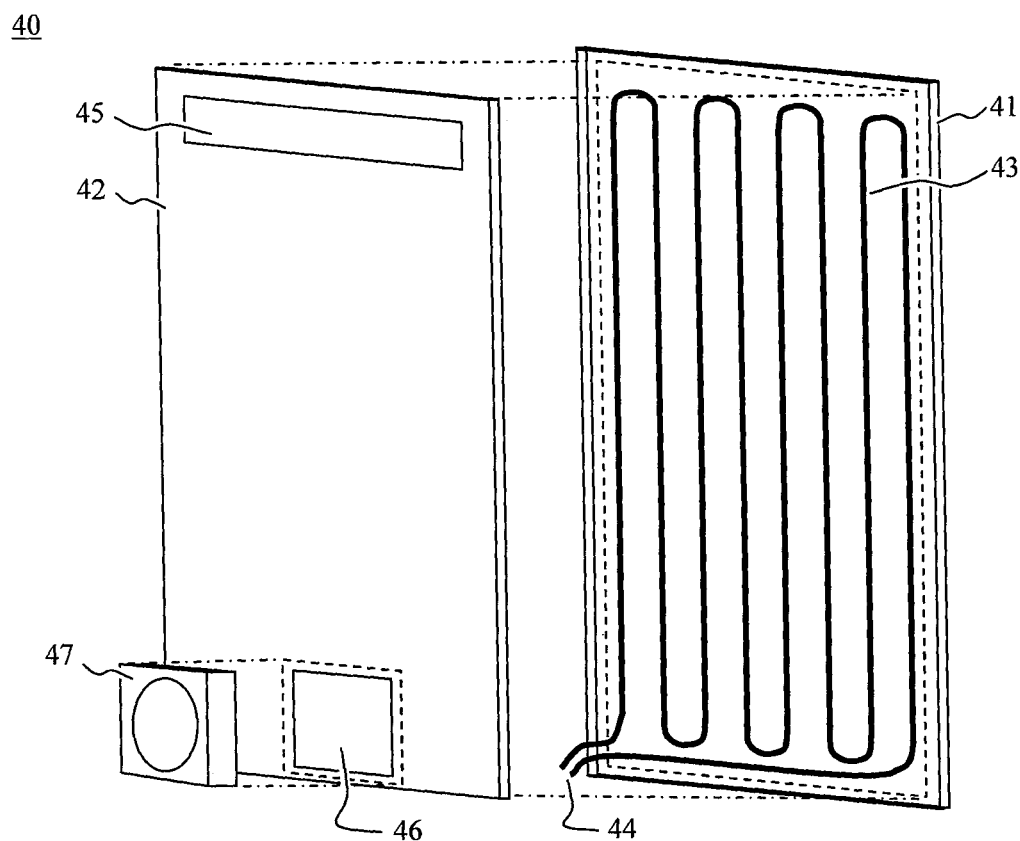
FIG. 4 presents a perspective illustration of a cooling arrangement according to the present invention.

FIG. 4 presents a more detailed example of an embodiment of a heat exchanger 40 assembled to the inside of the enclosure door, in a perspective view. Here a piping 43 for cooling liquid circulation is located in an air channel formed between a door 41 and a cover plate 42 which is attached to the door 41. The liquid piping 43 may be attached to either of parts 41 or 42, and it is connected to the main cooling liquid circulation via flexible connection pipes 44. In this example the location of both connection pipes are at the bottom, but as well one of them or both may be located on the top. The cover plate 42 comprises a top end aperture 45 and a bottom end aperture 46 for air circulation. The air circulation may be forced by a cooling fan 47 attached on the bottom end aperture 46.

Noteworthy is that the invention does not impose any restrictions on the type or shape of the air to liquid cooler as long as the cooler can fit inside the air channel. Shown piping 43 in FIG. 4 is only one example of a possible cooler embodiment.

Figure 5:
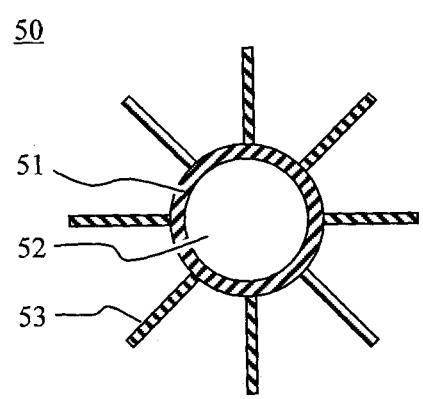
FIGS. 5 and 6 present details of liquid coolers.
Figure 6:
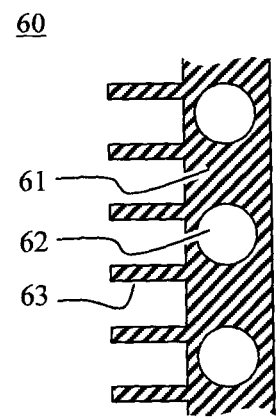

FIGS. 5 and 6 present details of some feasible possibilities for an air to liquid cooler possible to use in arrangements according to the present invention.

FIG. 5 presents a cross-section of a brush type cooler pipe 50, wherein the space 52 for the flowing liquid is inside a pipe 51 with attached spikes 53 for enlarging the heat transfer area from the air to the pipe 51 and further to the liquid. As an example, the piping 43 in FIG. 4 could be implemented with this kind of a cooler pipe.

FIG. 6 presents a ribbed type heatsink 60, wherein the holes 62 for the flowing liquid is inside a heatsink 61 with ribs 63 for enlarging the heat transfer area from the air to the heatsink 61 and further to the liquid.

The specific examples provided in the description above are not exhaustive unless otherwise explicitly stated, nor should they be construed as limiting the scope and/or the applicability of the accompanied claims. The features recited in the accompanied dependent claims are mutually freely combinable unless otherwise explicitly stated. The verbs "to comprise" and "to include" are used in this document as open limitations that neither exclude nor require the existence of also un-recited features. Furthermore, it is to be understood that the use of "a" or "an", i.e. a singular form, throughout this document does not exclude a plurality.

What is claimed is:

1. An arrangement for cooling inside air of an enclosure which houses a liquid cooled power electronics device within the enclosure, wherein components of the liquid cooled power electronics device are cooled by a main liquid circulation, the arrangement comprising:
   a cover plate attached to a door of the enclosure, the door or the cover plate having apertures at a top end and at a bottom end so as to form an air channel between the cover plate and the door, the air channel connecting to inside of the enclosure; and
   an air to liquid heat exchanger which is attached to the door of the enclosure, and is located between the cover plate and the door,
   wherein the air to liquid heat exchanger further comprises a cooler with internal liquid circulation, the internal liquid circulation of the cooler being connected to the main liquid circulation of the liquid cooled power electronics device, and
   the inside air of the enclosure is passed through the aperture at the top into the air channel, cooled by the cooler and returned to the inside of the enclosure.

2. The arrangement as claimed in claim 1, wherein the heat exchanger is connected to the main liquid circulation of the power electronics device by flexible connection pipes which allow the door of the enclosure to be opened without disturbing the internal liquid circulation of the cooler.

3. The arrangement as claimed in claim 2, wherein the heat exchanger is attached to inside of the door of the enclosure, the plate having apertures at the top end and at the bottom end.

4. The arrangement as claimed in claim 2, wherein the heat exchanger is attached to outside of the door of the enclosure, the door having apertures at the top end and at the bottom end.

5. The arrangement according to claim 2, wherein a direction of air flow in the air channel of the air to liquid heat exchanger is vertical.

6. The arrangement according to claim 2, wherein the inside air of the enclosure is circulated through the air channel of the heat exchanger by gravity.

7. The arrangement as claimed in claim 1, wherein the heat exchanger is attached to inside of the door of the enclosure, the plate having apertures at the top end and at the bottom end.

8. The arrangement according to claim 7, wherein a direction of air flow in the air channel of the air to liquid heat exchanger is vertical.

9. The arrangement as claimed in claim 1, wherein the heat exchanger is attached to outside of the door of the enclosure, the door having apertures at the top end and at the bottom end.

10. The arrangement according to claim 9, wherein a direction of air flow in the air channel of the air to liquid heat exchanger is vertical.

11. The arrangement according to claim 1, wherein a direction of air flow in the air channel of the air to liquid heat exchanger is vertical.

12. The arrangement according to claim 1, wherein the inside air of the enclosure is circulated through the air channel of the heat exchanger by gravity.

13. The arrangement according to claim 1, further comprising a fan assembled on an aperture of the air channel for circulating the inside air of the enclosure through the air channel of the heat exchanger.

14. The arrangement according to claim 1, wherein the arrangement does not comprise a fan.

15. A liquid cooled power electronic converter mounted inside an enclosure, wherein a cover plate attached to a door of the enclosure, the door or the cover plate having apertures at a top end and at a bottom end so as to form an air channel between the cover plate and the door, the air channel connecting to inside of the enclosure, wherein inside air of the enclosure is cooled by circulating air through an air channel of an air to liquid heat exchanger attached to the door of the enclosure, and is located between the cover plate and the door, wherein the heat exchanger further comprises a cooler with internal liquid circulation, the internal liquid circulation of the cooler being connected to a main liquid circulation of the liquid cooled power electronic converter, wherein components of the liquid cooled power electronic converter are cooled by the main liquid circulation, and wherein the inside air of the enclosure is passed through the aperture at the top into the air channel, cooled by the cooler and returned to the inside of the enclosure.

16. An arrangement for cooling inside air of an enclosure of a liquid cooled power electronics device, the arrangement comprising:
a cover plate attached to a door of the enclosure, the door or the cover plate having apertures at a top end and at a bottom end so as to form an air channel between the cover plate and the door, the air channel connecting to inside of the enclosure; and
an air to liquid heat exchanger which is attached to the door of the enclosure, and is located between the cover plate and the door,
wherein the air to liquid heat exchanger further comprises a cooler with internal liquid circulation, the internal liquid circulation of the cooler being connected to a main liquid circulation of the liquid cooled power electronics device,
the inside air of the enclosure is passed through the aperture at the top into the air channel, cooled by the cooler and returned to the inside of the enclosure, and
the liquid cooled power electronics device is arranged within the enclosure.

17. The arrangement according to claim 16, wherein the liquid cooled power electronics device is a frequency converter.

* * * * *